(12) United States Patent
Kashio et al.

(10) Patent No.: US 8,653,569 B2
(45) Date of Patent: Feb. 18, 2014

(54) TRANSISTOR, DISPLAY DEVICE, ELECTRONIC DEVICE, MANUFACTURING METHOD OF TRANSISTOR, AND MANUFACTURING METHOD OF DISPLAY DEVICE

(75) Inventors: Yukio Kashio, Toyko (JP); Tatsuya Miyakawa, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 529 days.

(21) Appl. No.: 12/891,855

(22) Filed: Sep. 28, 2010
(Under 37 CFR 1.47)

(65) Prior Publication Data

US 2011/0220896 A1      Sep. 15, 2011

(51) Int. Cl.
*H01L 31/113* (2006.01)

(52) U.S. Cl.
USPC .................................. 257/291; 257/E29.293

(58) Field of Classification Search
USPC ................ 257/59, 66, 72, E29.293, 291
See application file for complete search history.

(56) References Cited

U.S. PATENT DOCUMENTS

2006/0011913 A1* 1/2006 Yamazaki ...................... 257/59

FOREIGN PATENT DOCUMENTS

| JP | 02-177563 A | 7/1990 |
|---|---|---|
| JP | 04-333284 A | 11/1992 |
| JP | 06-326310 A | 11/1994 |
| JP | 08-330600 A | 12/1996 |
| JP | 2913737 B2 | 6/1999 |
| JP | 2002-033481 A | 1/2002 |
| JP | 2006-147811 A | 6/2006 |

OTHER PUBLICATIONS

Chinese Office Action dated Nov. 15, 2012 (and English translation thereof) in counterpart Chinese Application No. 201010549758.2.
Japanese Office Action dated Apr. 16, 2013 (and English translation thereof) in counterpart Japanese Application No. 2009-229063.

* cited by examiner

*Primary Examiner* — Laura M Menz
*Assistant Examiner* — Candice Y Chan
(74) *Attorney, Agent, or Firm* — Holtz, Holtz, Goodman & Chick

(57) ABSTRACT

An electric-field blocking film is provided between a BL insulation film and BL insulation film of a transistor, and a blocking film includes those three layers. The electric-field blocking film blocks an electric field produced by a drain electrode, a source electrode, and an $n^+$-Si film. Even if misalignment of the drain electrode, the source electrode, and the $n^+$-Si film in each drive transistor varies to make a portion overlying an i-Si film larger, therefore, the electric field at this portion is blocked by the electric-field blocking film, thereby making a variation in characteristic smaller.

10 Claims, 13 Drawing Sheets

WHEN THERE IS LARGE OVERLAPPING OF
SD ELECTRODE 87d ON DRAIN SIDE AND
BL INSULATION FILM 85 (Ls1<Ld1)

WHEN THERE IS LARGE OVERLAPPING OF
SD ELECTRODE 87s ON SOURCE SIDE AND
BL INSULATION FILM 85 (Ls2>Ld2)

TRANSISTOR, DISPLAY DEVICE, ELECTRONIC DEVICE, MANUFACTURING METHOD OF TRANSISTOR, AND MANUFACTURING METHOD OF DISPLAY DEVICE

CROSS-REFERENCE TO RELATED APPLICATION

This application claims the benefit of Japanese Patent Application No. 2009-229063, filed Sep. 30, 2009, the entire disclosure of which is incorporated by reference herein.

FIELD

The present invention relates to a transistor, a display device, an electronic device, a manufacturing method of a transistor, and a manufacturing method of a display device.

BACKGROUND

As next generation display devices to liquid crystal displays (LCDs), display devices with a display panel which has a two-dimensional array of light emitting device type luminous devices, such as an organic EL element (hereinafter called "organic EL element"), have been studied and developed recently (see Unexamined Japanese Patent Application KOKAI Publication No. H08-330600 (Patent Literature 1)).

An organic EL element includes an anode electrode, a cathode electrode, and an organic EL layer (luminous layer) which is formed between the pair of electrodes and has, for example, a luminous layer, a hole injection layer, etc. The organic EL element emits light based on energy generated by recombination of holes and electrons in the luminous layer.

A display device includes a plurality of n-channel FETs (Field Effect Transistors) for driving such organic EL elements.

Misalignment of the source electrode, the drain electrode, etc. may occur in such a transistor.

FIG. 13A and FIG. 13B are cross-sectional views showing the transistor. The transistor comprises a substrate 81, a gate electrode 82, a gate insulation film 83, an i-Si film 84, a BL (blocking layer) insulation film 85, an n$^+$-Si film 86, a drain-side SD (Source/Drain) electrode 87d, a source-side SD electrode 87s, and an overcoat insulation film 88.

FIG. 13A shows a case where the SD electrodes 87d, 87s are laminated on the BL insulation film 85, around the gate electrode 82, disproportionally on the drain side. That is, FIG. 13A shows a case where Ls1<Ld1 (where Ls1 is the overlying length of the SD electrode 87s and the BL insulation film 85, and Ld1 is the overlying length of the SD electrode 87d and the BL insulation film 85).

FIG. 13B shows a case where the SD electrodes 87d, 87s are laminated on the BL insulation film 85, around the gate electrode 82, disproportionally on the source side. That is, FIG. 13B shows a case where Ls2>Ld2 (where Ls2 is the overlying length of the SD electrode 87s and the BL insulation film 85, and Ld2 is the overlying length of the SD electrode 87d and the BL insulation film 85).

When a source potential Vs=0 V is applied to the source electrode, a drain potential Vd=10 V is applied to the drain electrode, and a gate-source voltage Vg as shown in FIGS. 14A and 14B is applied to the gate electrode, the characteristic varies between the case shown in FIG. 13A and the case shown in FIG. 13B. Note that the scale of a drain current Id differs between FIG. 14A and FIG. 14B.

As shown in FIGS. 14A and 14B, the variation in characteristic particularly affects the ON current. A variation in ON current affects the amount of light from the organic EL element.

SUMMARY

In consideration of the foregoing conventional problem, therefore, it is an object of the present invention to provide a transistor, a display device, an electronic device, and a transistor manufacturing method, which can suppress a variation in characteristic.

To achieve the object, a transistor according to a first aspect of the invention includes a semiconductor film formed above a substrate, a blocking film formed on the semiconductor film, and having three layers of a first insulation film, an electric-field blocking film and a second insulation film from the substrate side, and a drain electrode and a source electrode formed opposite each other on the blocking film, wherein the electric-field blocking film is formed to overlie at least part of the drain electrode via the second insulation film in a layer direction.

The electric-field blocking film may be formed so that the drain electrode and the source electrode overlie the electric-field blocking film one another in the layer direction.

An impurity semiconductor film that electrically connects the drain electrode and the source electrode to the semiconductor film may be formed between the electric-field blocking film and each of the drain electrode and the source electrode, and the electric-field blocking film may block an electric field formed by the drain electrode, the source electrode, and the impurity semiconductor film.

The electric-field blocking film may be formed of a conductive material having translucency.

The electric-field blocking film may be set to a voltage within a preset range.

The transistor may further include a gate electrode to which the electric-field blocking film is connected.

The first insulation film and the second insulation film may be formed of a same material.

A display device may include the transistor, and a light emitting device having a pixel electrode, an opposing electrode, and a luminous layer formed between the pixel electrode and the opposing electrode, the transistor being connected to the pixel electrode.

A display device may include a light emitting device having a pixel electrode, an opposing electrode, and a luminous layer formed between the pixel electrode and the opposing electrode, a drive transistor that drives the light emitting device, and a switch transistor that selects the light emitting device, the drive transistor being the transistor.

The electric-field blocking film may be formed of a same material as the pixel electrode.

An electronic device may include the display device.

To achieve the object, a manufacturing method of a transistor according to a second aspect of the invention includes the steps forming a blocking film on a semiconductor film formed above a substrate, and having three layers of a first insulation film, an electric-field blocking film and a second insulation film from the substrate side, and forming a conductive film on the second insulation film, and patterning the formed conductive film to overlie the electric-field blocking film via the second insulation film to form a drain electrode and a source electrode.

In the step of forming the drain electrode and source electrode, the drain electrode and the source electrode may be formed after a contact film for providing electric connection to the semiconductor film is formed on the second insulation film.

The manufacturing method may further include a step of forming a gate electrode on the substrate before the step of forming the blocking film in which step the electric-field blocking film is connected to the gate electrode.

A manufacturing method of a display device according to a third aspect of the invention may further include a step of forming a light emitting device having a pixel electrode, an opposing electrode, and a luminous layer formed between the pixel electrode and the opposing electrode, wherein a conductive film to be the pixel electrode is patterned to form the pixel electrode in the step of forming the light emitting device together with the electric-field blocking film in the step of forming the blocking film.

In the step of forming the blocking film, the first insulation film may be patterned after which the electric-field blocking film and the pixel electrode may both be formed of a conductive material having translucency by patterning, and finally the second insulation film may be patterned.

BRIEF DESCRIPTION OF THE DRAWINGS

A more complete understanding of this application can be obtained when the following detailed description is considered in conjunction with the following drawings, in which.

DETAILED DESCRIPTION

A transistor, a display device, and an electronic device which include a transistor according to an embodiment of the present invention, and a manufacturing method of the transistor will be described below with reference to the accompanying drawings.

First Embodiment

Figure 1A:
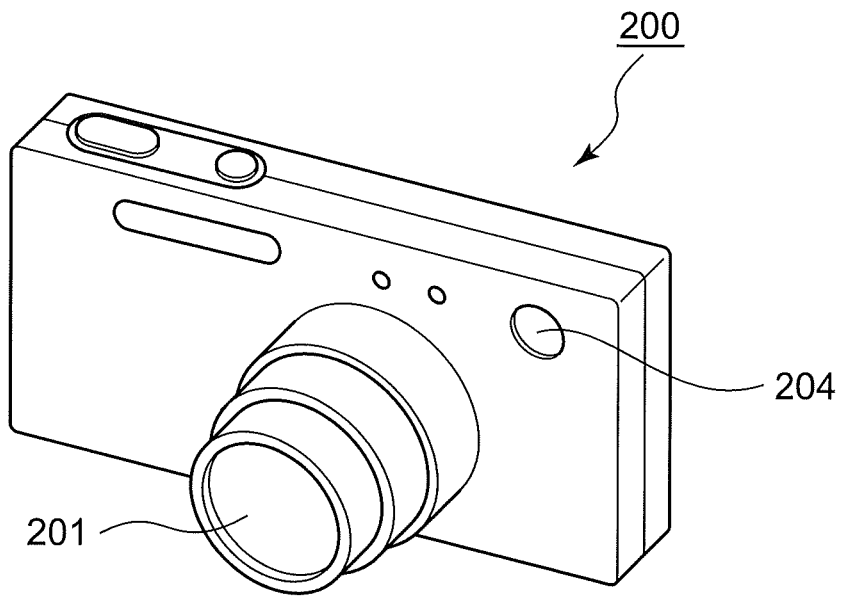
FIGS. 1A and 1B are diagrams showing an electronic device (digital camera) in which a display device according to one embodiment of the invention is mounted.
Figure 1B:
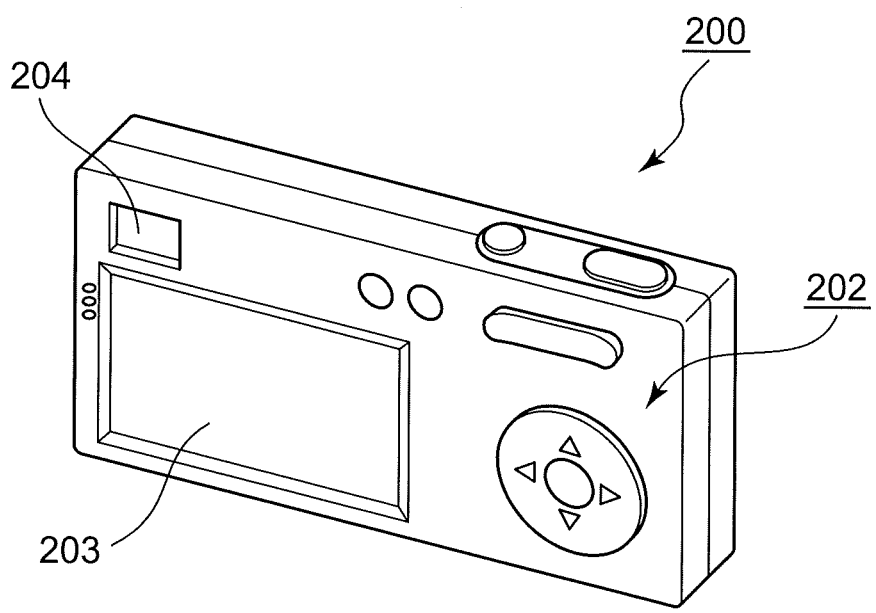
Figure 2:
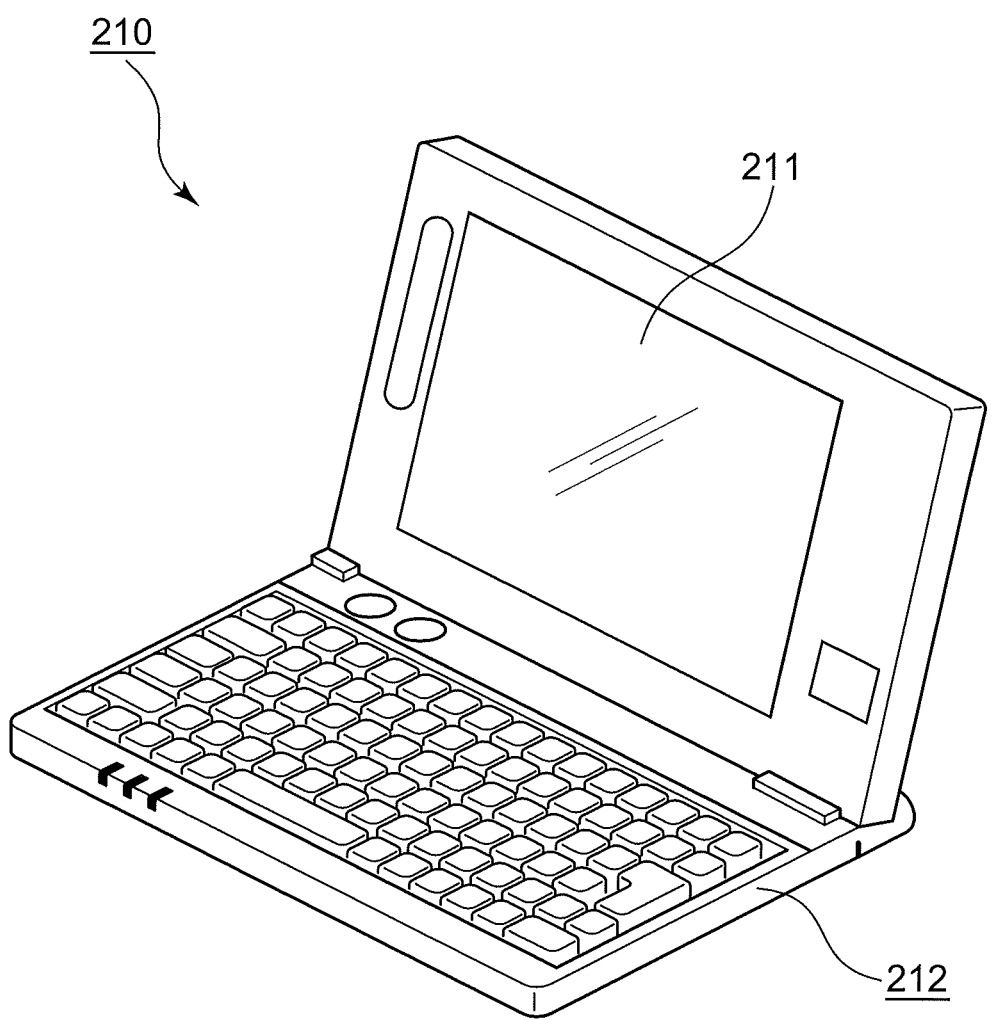
FIG. 2 is a diagram showing an electronic device (computer) in which a display device fabricated using a coating equipment is mounted.
Figure 3:
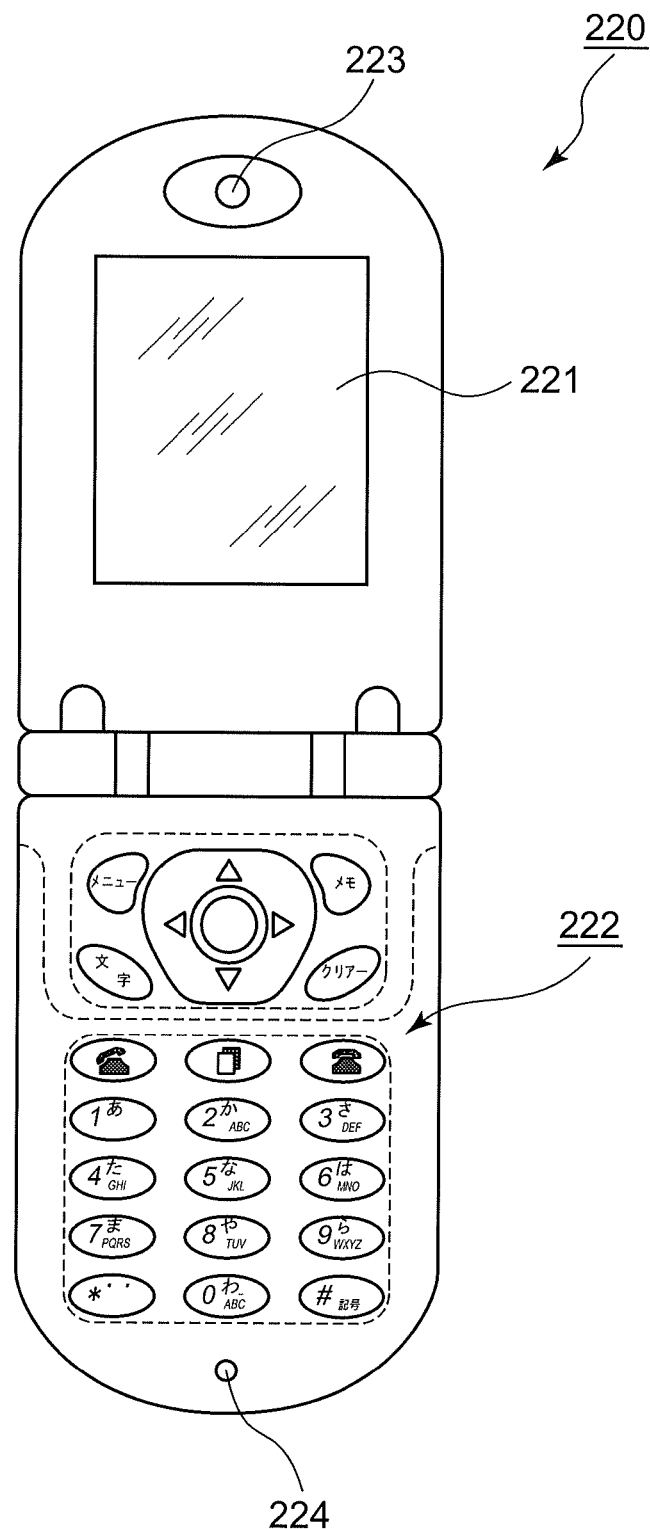
FIG. 3 is a diagram showing an electronic device (cellular phone) in which the display device fabricated using the coating equipment is mounted.

A display device 1 is mounted in a digital camera as shown in FIGS. 1A and 1B, a computer as shown in FIG. 2, and an electronic device as shown in FIG. 3.

A digital camera 200 includes a lens part 201, an operation part 202, a display part 203, and a finder 204 as shown in FIGS. 1A and 1B. The display device 1 is used for the display part 203.

A computer 210 shown in FIG. 2 includes a display part 211, and an operation part 212, and uses the display device 1 for the display part 211.

A cellular phone 220 shown in FIG. 3 includes a display part 221, an operation part 222, a receiver part 223, and a transmitter part 224, and uses the display device 1 for the display part 221.

Figure 4:
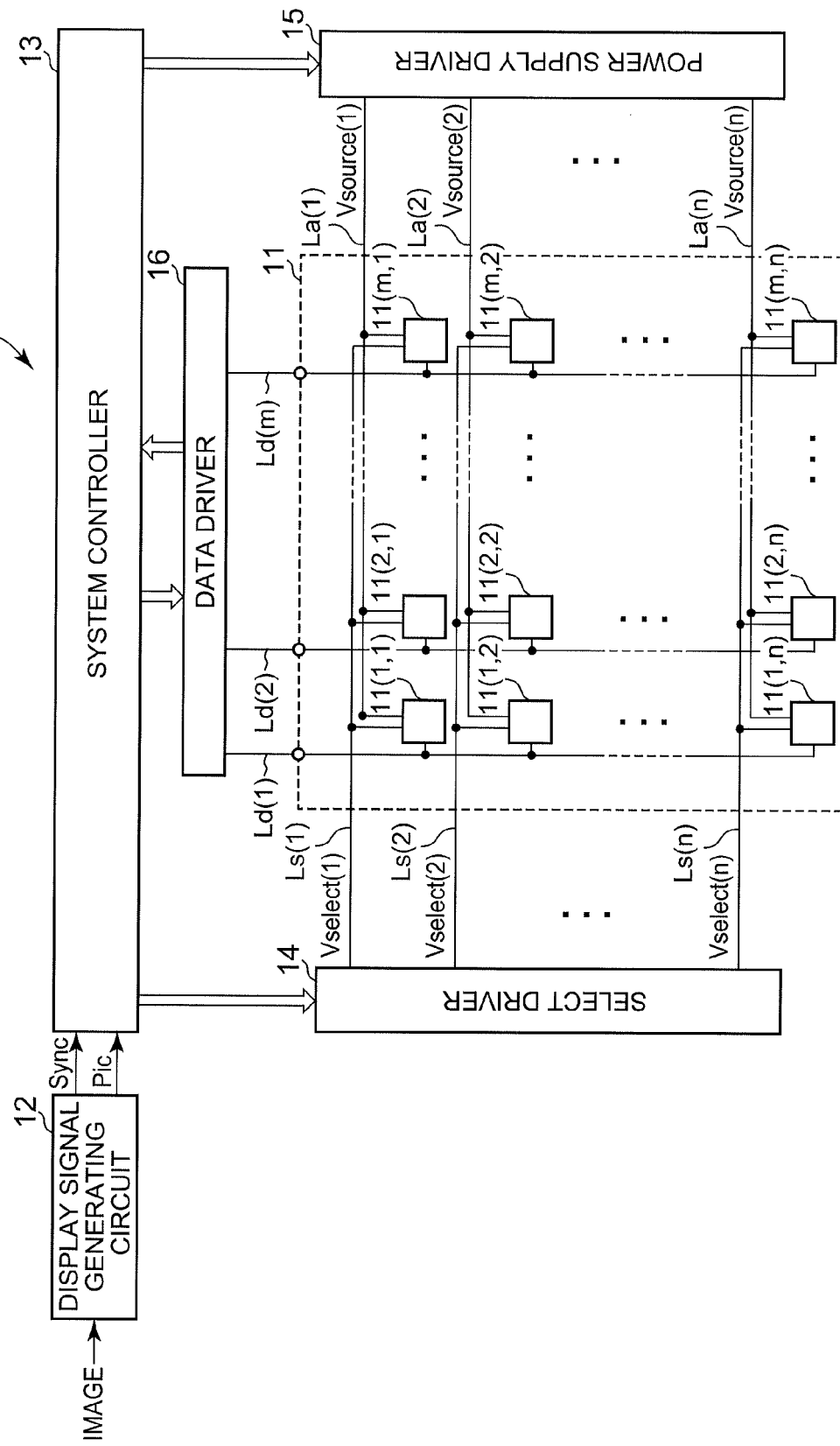
FIG. 4 is a diagram illustrating the configuration of the display device.

As shown in FIG. 4, this display device 1 includes a TFT panel 11, a display signal generating circuit 12, a system controller 13, a select driver 14, a power supply driver 15, and a data driver 16.

The TFT panel 11 has a plurality of pixel circuits 11(i,j) (i=1 to m, j=1 to n, m and n: natural number).

Figure 5:
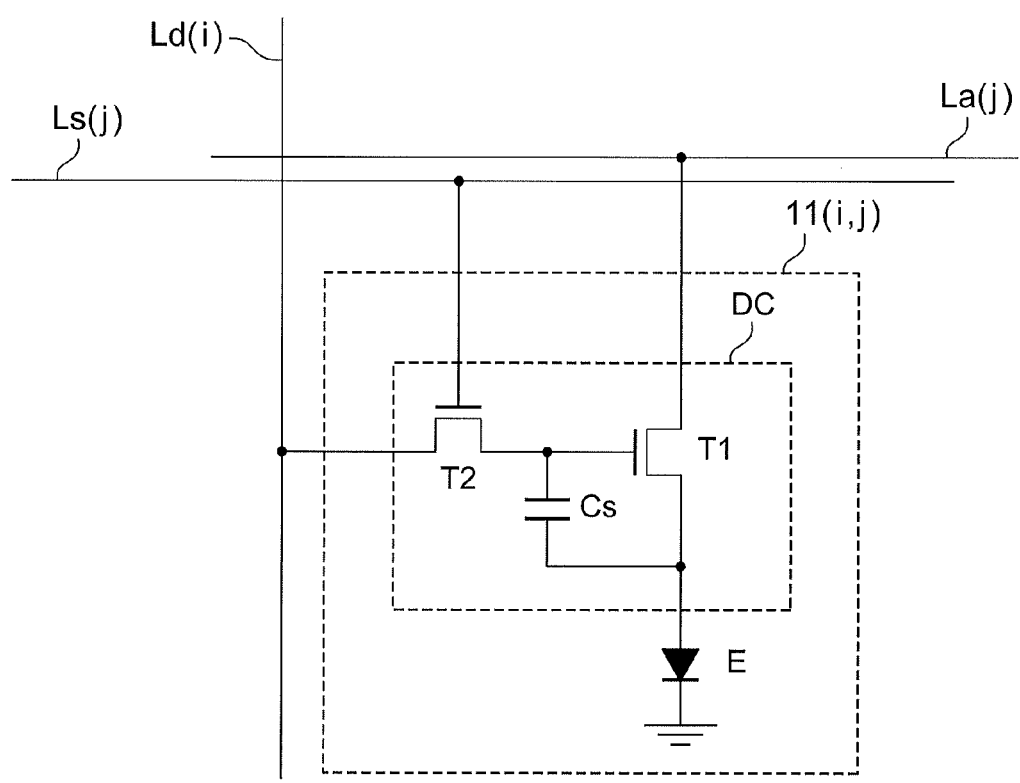
FIG. 5 is a circuit diagram illustrating the configuration of each pixel circuit shown in FIG. 4.

The individual pixel circuit 11(i,j), each of which is a display pixel corresponding to one pixel of an image, are laid out in a matrix form. As shown in FIG. 5, each pixel circuit 11(i,j) has an organic EL element E, a drive transistor T1, a switch transistor T2, and a capacitor Cs. The drive transistor T1, the switch transistor T2 and the capacitor Cs constitute a pixel drive circuit DC.

The organic EL element E is a light emitting device (display device) which emits light using the phenomenon that light is emitted by excitons which are generated by recombination of electrons and holes injected into an organic compound, and emits light with luminance corresponding to the value of the current supplied.

The drive transistor T1 and the switch transistor T2 in the pixel drive circuit DC are both TFTs (Thin Film Transistors) each formed by an n-channel FET.

The drive transistor T1 is a drive transistor for the organic EL element E, and has a drain connected to an anode line La(j) and a source connected to the anode electrode of the organic EL element E.

The switch transistor T2 is a transistor which serves as a switch to select the organic EL element E, and has a drain connected to a data line Ld(i), a source connected to the gate of the drive transistor T1, and a gate connected to a select line Ls(j).

The capacitor Cs, which serves to hold the gate-source voltage of the drive transistor T1, is connected between the gate and source of the drive transistor T1.

In case of three colors of red (R), blue (B) and green (G), the display device 1 has such a pixel circuit 11(i,j) for each color.

The pixel circuit 11(i,j) may include three transistors.

The display signal generating circuit 12 is externally supplied with a video signal Image, such as a composite video signal or a component video signal, and acquires display data Pic like a luminance signal, and a sync signal Sync from the supplied video signal Image. The display signal generating circuit 12 supplies the acquired display data Pic and sync signal Sync to the system controller 13.

The system controller 13 controls a correction process, a writing operation, and an emission operation on the display data Pic based on the display data Pic and sync signal Sync supplied from the display signal generating circuit 12.

The correction process on the display data Pic corrects the display data Pic supplied from the display signal generating circuit 12 based on the values of a threshold voltage Vth and a current amplification factor β of each pixel circuit 11(i,j) to thereby generate a gradation signal.

The writing operation writes a voltage according to the generated gradation signal in the capacitor Cs of each pixel circuit 11(i,j). The emission operation supplies a current corresponding to the voltage held in the capacitor Cs to the organic EL element E to cause the organic EL element E to emit light.

To perform such control, the system controller 13 generates and supplies various control signals to the select driver 14, the power supply driver 15, and the data driver 16, and supplies the generated gradation signal to the data driver 16.

The select driver 14 sequentially sects rows of the TFT panel 11, and is constituted by, for example, a shift register. The select driver 14 is connected to the gates of the drive transistors T1 and the switch transistors T2 of the individual pixel circuits 11(i,j) via select lines Ls(j) (j=1 to n), respectively.

Based on the control signal supplied from the system controller 13, the select driver 14 sequentially outputs high-level select signals Vselect(j) to the first row of pixel circuits 11(1, 1) to 11(m,1) and the nth row of pixel circuits 11(1,n) to 11(m,n) to select the rows of the TFT panel 11 sequentially.

The power supply driver 15 outputs signals Vsource(1) to Vsource(n) with a voltage VL or a voltage VH to the anode lines La(1) to La(n), respectively.

The voltage VL is set to a negative voltage or the ground potential or the cathode voltage of the organic EL element E. The voltage VH is a positive voltage capable of causing the organic EL element E of each pixel circuit 11(i,j) to emit light, and is set to +15 V, for example. It is to be noted that the voltage VL, VH is variable, not a fixed voltage, when gradation control is performed.

The power supply driver 15 is connected to the drains of the drive transistors T1 of the individual pixel circuits 11(i,j) via the anode lines La(j) (j=1 to n), respectively.

The data driver 16 applies voltage signals Sv(1) to Sv(1m) to the respective data lines Ld(1) to Ld(m) based on the gradation signal supplied from the system controller 13.

The display device 1 is not limited to the configuration such that a plurality of light emitting devices are used as a set of pixels in a fixed manner, and may take a configuration where a plurality of logical pixels share a single light emitting device.

For example, a single light emitting device is used to constitute five types of logical pixels. Specifically, a single light emitting device is used as the core of logical pixels, and the remaining light emitting devices are used as part of logical pixels around the peripheral pixels. The use of a single light emitting device multiple times this way can enhance the resolution better than the configuration where one set of pixels is used in a fixed manner.

Next, the configuration of the pixel circuit 11(i,j) of the display device 1 will be described referring to FIGS. 6 and 7.

Figure 6:
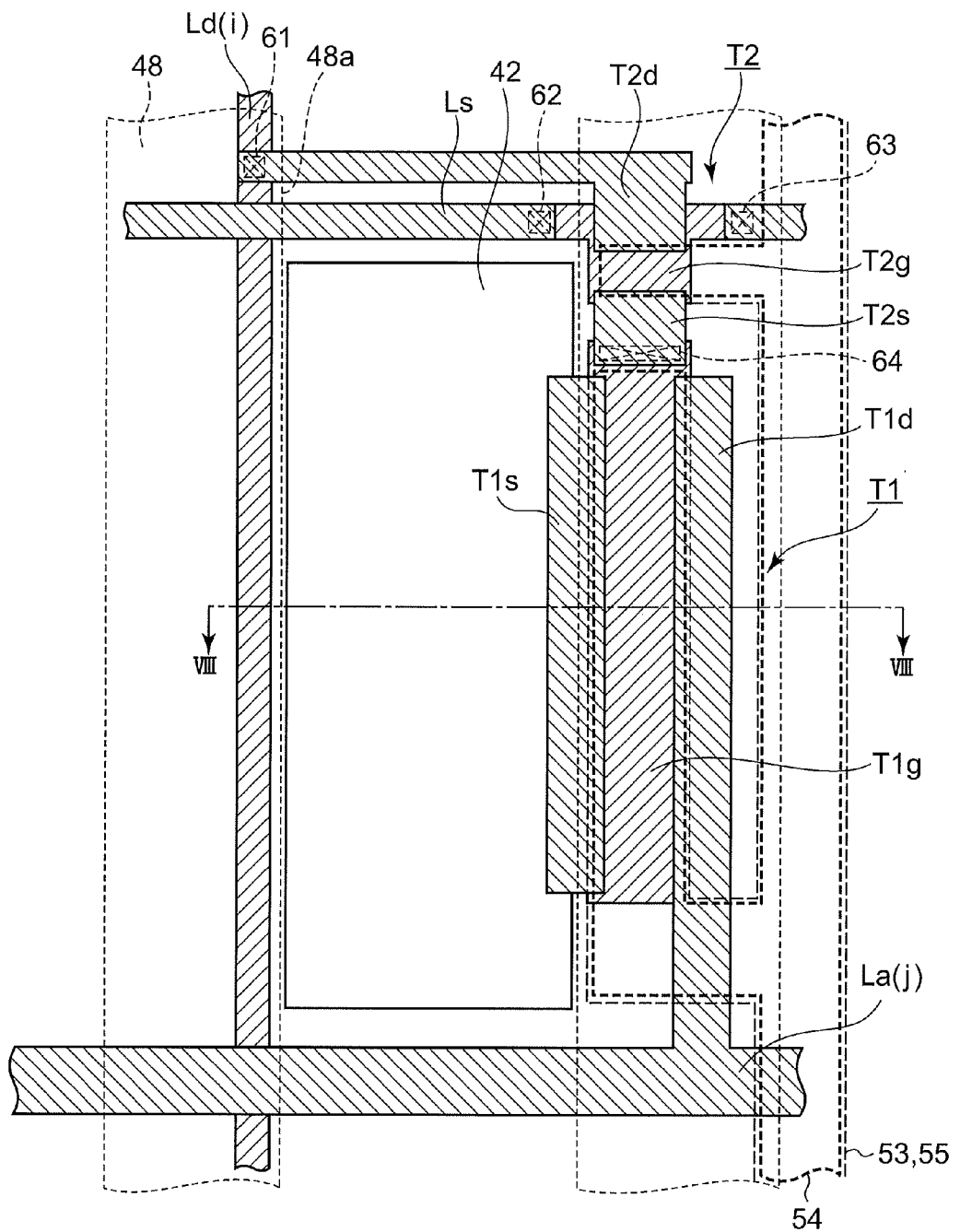
FIG. 6 is a plan view of a luminous pixel.
Figure 7:
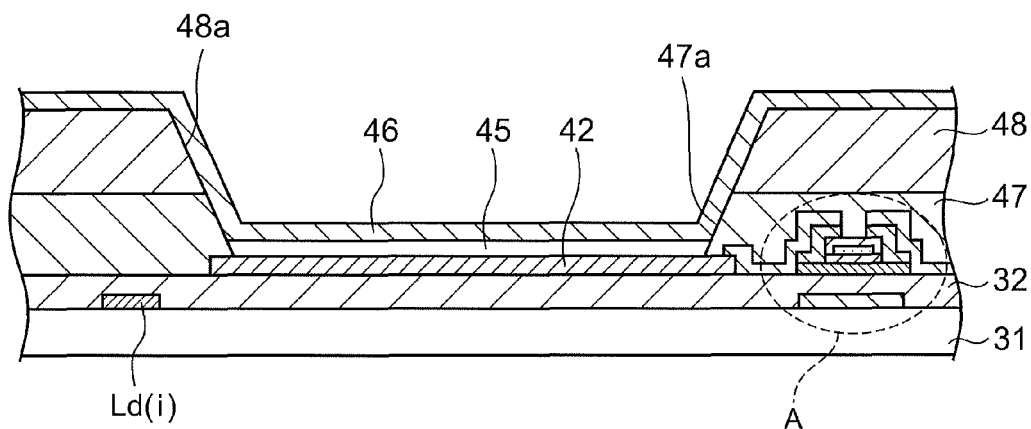
FIG. 7 is a cross-sectional view along line VIII-VIII shown in FIG. 6.

FIG. 6 is a plan view of one pixel circuit 11(i,j) in the display device 1, and FIG. 7 is a cross-sectional view of this pixel circuit 11(i,j) in the display device 1 along line VIII-VIII. This display device 1 has a pixel electrode (anode electrode) 42, a luminous layer 45, and an opposing electrode (cathode electrode) 46.

A gate electrode T1g of the drive transistor T1 is formed on a substrate 31 of each luminous pixel. Data lines Ld(i) extending in the column direction are formed adjacent to the individual luminous pixels on the substrate 31. T1d and T1s respectively denote the drain electrode and source electrode of the drive transistor T1, while T2g, T2d and T2s respectively denote the gate electrode, drain electrode and source electrode of the switch transistor T2.

The pixel electrode 42 is supplied with a current, and is formed of a conductive material having translucency, such as ITO (Indium Tin Oxide) or ZnO. Each pixel electrode 42 is insulated by the pixel electrodes 42 of other luminous pixels adjacent to the pixel electrode 42, and an interlayer insulation film 47.

The interlayer insulation film 47 is formed of an insulating material, such as silicon nitride, and is formed between the pixel electrodes 42 to insulatively protect the drive transistor T1, the switch transistor T2, the select lines Ls(j), and the anode lines La(j).

An opening 47a with an approximately quadrate shape is formed in the interlayer insulation film 47 to define the emission region of the luminous pixel. Further, a groove-shaped opening 48a extending in a main scan direction X is formed in a partition 48 on the interlayer insulation film 47 over a plurality of luminous pixels.

The partition 48 is formed of an insulating material, e.g., a cured photosensitive resin, such as polyimide, and is formed on the interlayer insulation film 47. The partition 48 is formed in a stripe pattern, so that openings are collectively formed in the pixel electrodes 42 of a plurality of luminous pixels along the main scan direction X. The planar shape of the partition 48 is not limited to that shape, and may be a lattice shape with an opening provided for each pixel electrode 42.

A yophobic treatment may be performed on the top surface of the partition 48 and the top surface of the interlayer insulation film 47. "Yophobic" indicates the property that repels both water solvents and organic solvents.

The luminous layer 45, which emits light, is formed on the pixel electrode 42. The luminous layer 45 emits light with a voltage applied between the pixel electrode 42 and the opposing electrode 46.

The luminous layer 45 is made of a known polymer luminous material capable of emitting fluorescent light or phosphorus light, e.g., a luminous material containing a conjugated double bond polymer, such as polyparaphenylene vinylene or polyfluorene.

The display device 1 may have a hole injection layer. The hole injection layer serves to supply holes to the luminous layer 45, and is provided between the pixel electrode 42 and the luminous layer 45.

The hole injection layer is made of an organic polymer material capable of hole injection and transportation, e.g., a conductive polymer, such as polyethylene dioxy thiophene (PEDOT), and polystyrene sulfonate (PSS) which is a dopant.

The interlayer serves to suppress the hole injection property of the hole injection layer to facilitate recombination of electrons and holes in the luminous layer 45, thereby enhancing the emission efficiency of the luminous layer 45, and is provided between the hole injection layer and the luminous layer 45.

The opposing electrode 46 is an electrode through which the current flows out from the organic EL element E.

There are a bottom emission type organic EL element E and a top emission type organic EL element E, and the structure of the opposing electrode 46 differs between the two types.

The bottom emission type organic EL element E is of the type where light from the luminous layer 45 is emitted downward in the diagram. In case of the bottom emission type, the opposing electrode 46 is provided on the luminous layer 45 side, and has a laminate structure having a bottom layer and a top layer. The bottom layer is made of a conductive material with a low work function, such as Li, Mg, Ca or Ba, and the top layer is made of a light reflective conductive metal, such as Al.

According to the embodiment, the opposing electrode 46 is comprised of a single electrode layer which is formed over a plurality of luminous pixels, and is applied with a common voltage, e.g., the ground potential.

The top emission type organic EL element E is of the type where light from the luminous layer 45 is emitted upward in the diagram. In case of the top emission type, the opposing electrode 46 is provided on the luminous layer 45 side, and has a transparent laminate structure having a transparent layer with a low work function and a transparent conductive layer.

The transparent low-work-function layer is a thin layer of 10 nm or so and made of a material with a low work function, such as Li, Mg, Ca or Ba, and the top layer is made of a light reflective conductive metal. The transparent conductive layer is a layer made of ITO or the like, and having a thickness of about 100 nm to 200 nm.

Figure 8:
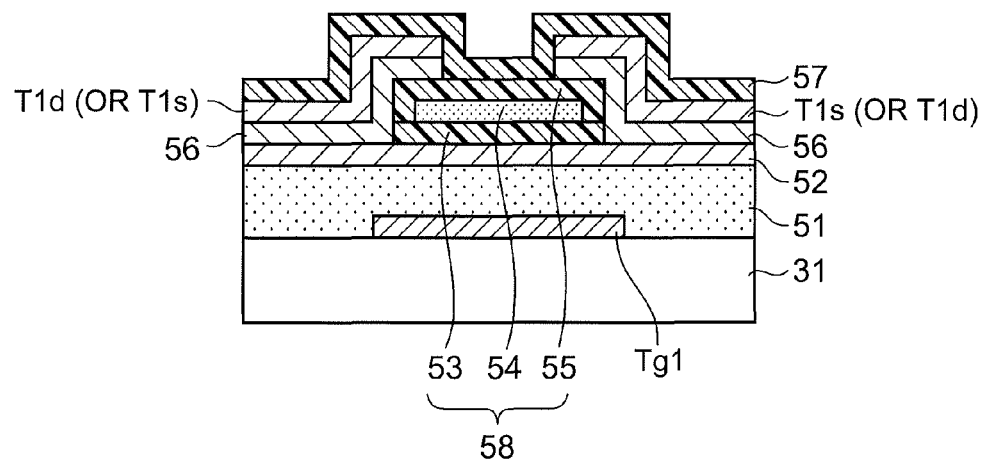
FIG. 8 is a cross-sectional view of a transistor shown in part A in FIG. 7.

Part A in FIG. 7 shows the cross section of the drive transistor T1 which includes, as shown in FIG. 8, the substrate 31, the gate electrode T1g, a gate insulation film 51, an i-Si film 52, a blocking film 58, an n$^+$-Si film (impurity semiconductor film) 56, the drain electrode T1d, the source electrode T1s, and an overcoat insulation film 57. The blocking film 58 has three layers of a BL insulation film 53, an electric-field blocking film 54, and a BL insulation film 55. It is to be noted that the overcoat insulation film 57 shown in FIG. 8 is identical to the interlayer insulation film 47 shown in FIG. 7, and will be explained herein as the overcoat insulation film 57.

The drive transistor T1 according to the embodiment differs from that of the related art in the structure of the blocking film 58 which has the electric-field blocking film 54 formed between the BL insulation film 53 and the BL insulation film 55.

The electric-field blocking film 54 is provided to block an electric field which is formed by the overlying drain electrode T1d, source electrode T1s and n$^+$-Si film 56, and is formed in a region indicated by a broken line in FIG. 6.

It is desirable that a conductive material with transparency, such as ITO or ZnO, should be used for the electric-field blocking film 54. As the same transparent conductive material as that for the pixel electrode 42 is used as the material for the electric-field blocking film 54, the electric-field blocking film 54 can be formed in the same process as the pixel electrode 42.

If Cr, a Cr alloy, Al, or an Al alloy were used for the drain electrode T1d and the source electrode T1s in a later step, the drain electrode T1d and the source electrode T1s would be dissolved by an etchant liquid of ITO. However, the formation of the electric-field blocking film 54 and the pixel electrode 42 in the same process prevents the materials for the drain electrode T1d and the source electrode T1s to be formed later from being exposed to the etchant.

Figure 9:
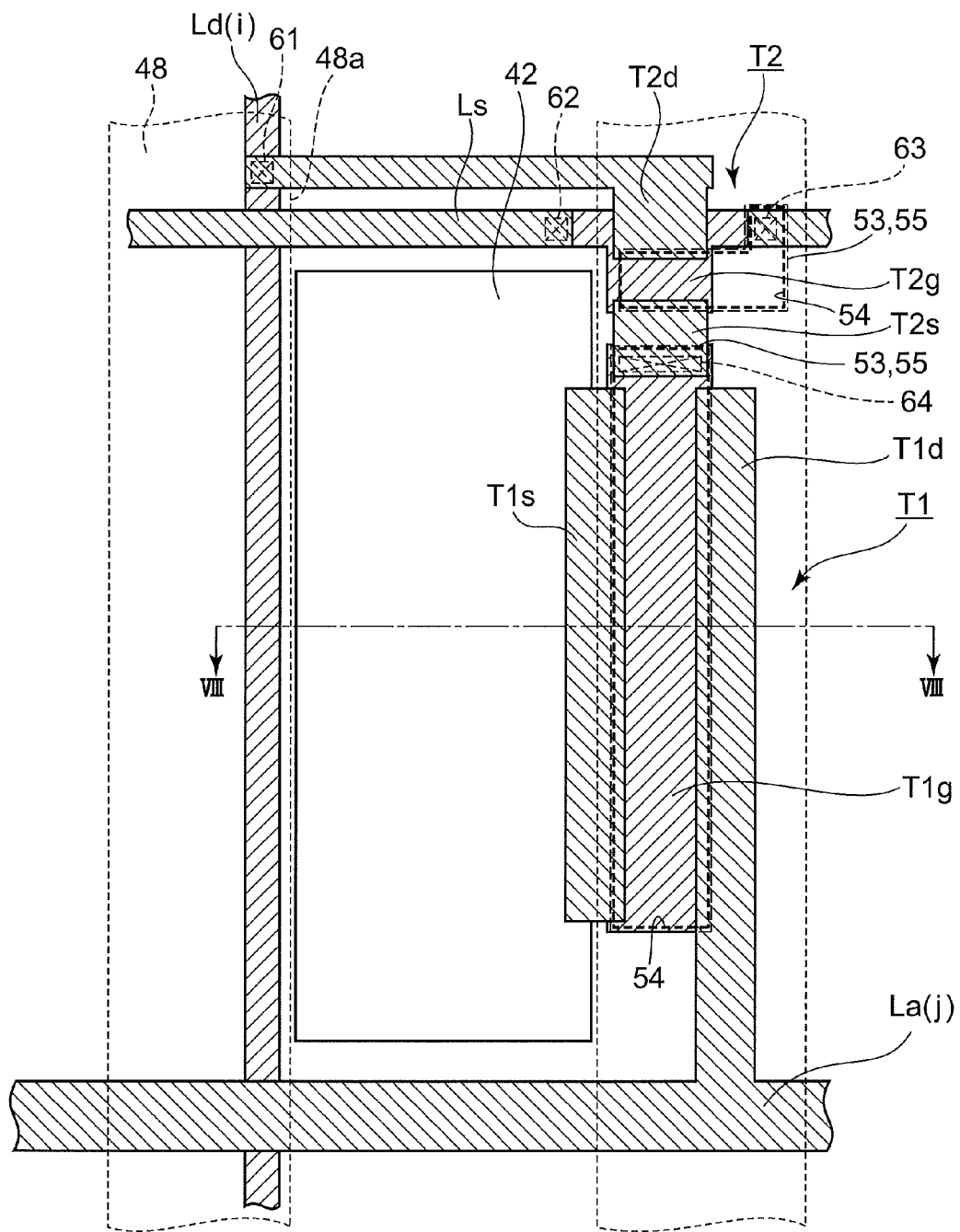
FIG. 9 is a plan view of a luminous pixel in which the electric-field blocking electrode of the transistor is connected to the gate electrode thereof.

The voltage of the electric-field blocking film 54 is set to lie within the range of preset voltages VL and VH of the signals Vsource(1) to Vsource(n). As shown in FIG. 9, the electric-field blocking film 54 may be connected to the gate electrode T1g to prevent the electric-field blocking film 54 from getting a floating potential. When the aforementioned gradation control is not performed, the voltage of the electric-field blocking film 54 is set to voltage VL=ground potential.

With the electric-field blocking film 54 provided, even if misalignment of the drain electrode T1d, the source electrode T1s, and the n$^+$-Si film 56 in each drive transistor T1 varies to make the portion overlying the i-Si film 52 larger, the electric field at this portion is blocked by the electric-field blocking film 54. Accordingly, a variation in characteristic becomes smaller. It is to be noted that the switch transistor T2 shown in FIG. 6 is configured in a similar manner.

Next, a manufacturing method of the drive transistor T1 will be described.

Figure 10A:
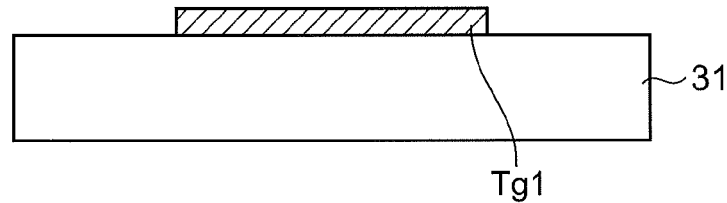
FIGS. 10A to 10C are diagrams (1) illustrating a manufacturing method of the transistor shown in FIG. 8.

As shown in FIG. 10A, the gate electrode T1g is formed on the substrate 31. The substrate 31 is formed by a glass substrate or the like, and the gate electrode T1g is comprised of, for example, an Mo film, Cr film, Al film, Cr/Al laminate film, AlTi alloy film, AlNdTi alloy film, MoNb alloy film or the like. The gate electrode T1g is formed by using sputtering, vacuum vapor deposition or the like. In this step, the gate electrode T2g of the switch transistor T2, and the data line Ld(i) are formed too.

Figure 10B:
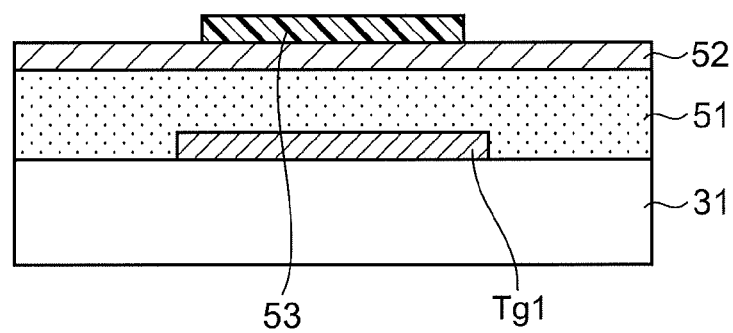

In the next step, as shown in FIG. 10B, the gate insulation film 51 is formed on the gate electrode T1g and the data line Ld(i). CVD (Chemical Vapor Deposition) or the like is used in the formation of the gate insulation film 51.

In the next step, the i-Si film 52 is formed on the gate insulation film 51. The i-Si film 52 is an undoped intrinsic semiconductor, and a channel is formed in the i-Si film 52.

In the next step, the BL insulation film 53 is formed on the i-Si film 52. The BL insulation film 53 is formed of SiN, for example, and is formed by using CVD or the like.

Figure 10C:
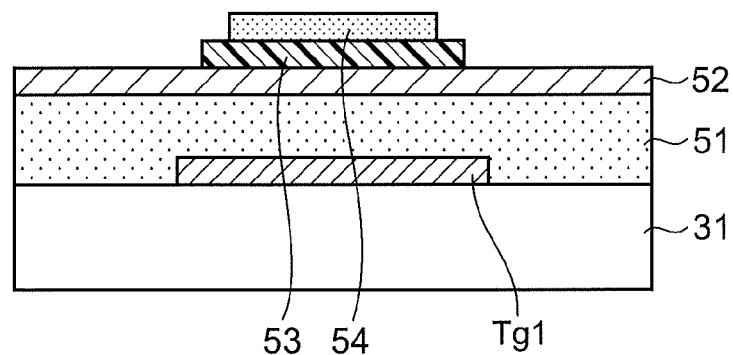

In the next step, as shown in FIG. 10C, the aforementioned electric-field blocking film 54 is formed on the BL insulation film 53. It is to be noted that the pixel electrode 42 shown in FIG. 7 is formed at this time too.

Figure 11A:
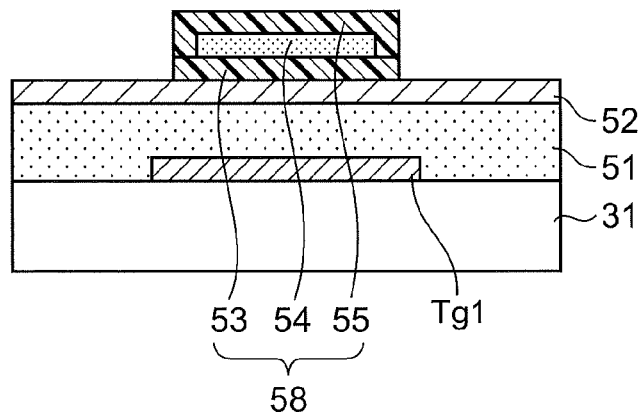
FIGS. 11A to 11C are diagrams (2) illustrating the manufacturing method of the transistor shown in FIG. 8.

In the next step, as shown in FIG. 11A, the BL insulation film 55 is formed to enclose the electric-field blocking film 54. The BL insulation film 55 is formed of SiN, a material similar to that for the BL insulation film 53, and is formed by using CVD or the like.

Figure 11B:
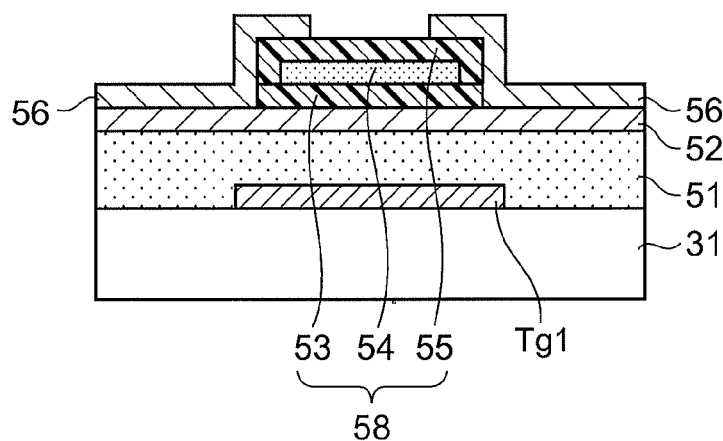

In the next step, as shown in FIG. 11B, the n$^+$-Si film 56 is formed on the BL insulation film 55, and is patterned. Although etching of the n$^+$-Si film 56 at that time etches the underlying i-Si film 52, the i-Si film 52 underlying the BL insulation film 55 remains unetched.

When the gate electrode T1g needs to be connected to the drain electrode T1d and the source electrode T1s, a contact hole is formed thereafter.

Figure 11C:
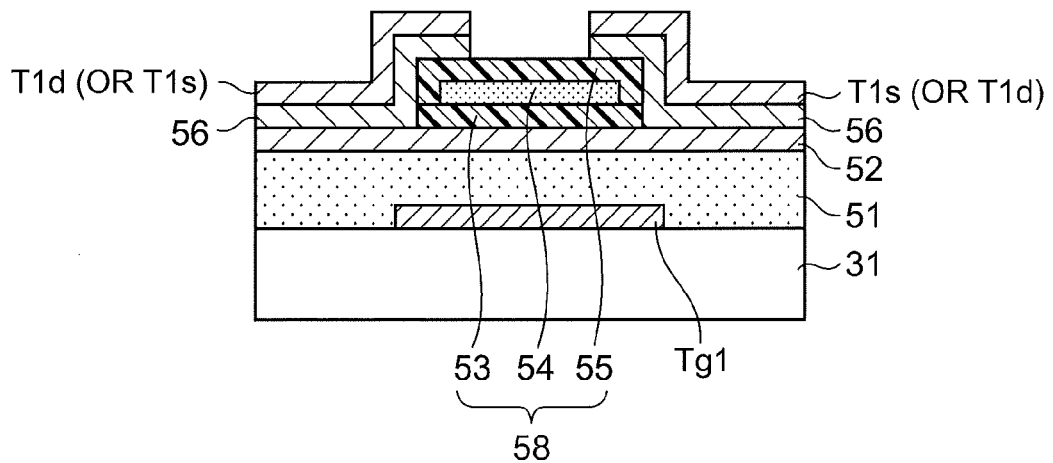

In the next step, as shown in FIG. 11C, the drain electrode T1d and the source electrode T1s are formed on the n$^+$-Si film 56. The drain electrode T1d and the source electrode T1s are comprised of, for example, an Mo film, Cr film, Al film, Cr/Al laminate film, AlTi alloy film, AlNdTi alloy film, MoNb alloy film or the like.

The drain electrode T1d and the source electrode T1s are formed by applying the materials for the drain electrode T1d and the source electrode T1s by sputtering, vacuum vapor deposition or the like, and then patterning them by photolithography to overlie the electric-field blocking film 54 in the layer direction.

Although the drain electrode T1d and the source electrode T1s are each formed to overlie the electric-field blocking film 54 in the layer direction, the electric-field blocking film 54 has only to overlap at least the drain electrode T1d in the layer direction.

At the same time, the anode lines La(j) are formed. At this time, each of the source electrodes T1s of the drive transistors T1 is formed so as to overly part of the pixel electrode 42.

In the next step, the overcoat insulation film 57 shown in FIG. 8 is formed so as to cover the entire surface. The overcoat insulation film 57 protects the drain electrode T1d and the source electrode T1s, and is comprised of a silicon nitride film, for example. CVD or the like is used in the formation of the overcoat insulation film 57. When terminal portions or the like are needed, perforation or the like is carried out in this step.

When the drive transistor T1, the switch transistor T2 and the like are formed this way, the opening 47a shown in FIG. 7 is formed. Photolithography is used in the formation of the opening 47a.

In the next step, the partition 48 shown in FIG. 7 is formed. The partition 48 is formed by applying photosensitive polyimide to cover the interlayer insulation film 47, performing exposure and development via a mask corresponding to the shape of the partition 48, and then performing patterning. The patterning is carried out so that the opening 48a is also formed.

In the next step, the luminous layer 45 is formed on the pixel electrode 42 shown in FIG. 7. The formation of the luminous layer 45 is carried out using a nozzle printing apparatus as shown in FIG. 12.

This nozzle printing apparatus includes a nozzle head 70 which a nozzle to continuously eject a solution 72 roughly comprised of an organic-compound containing liquid, and applies the solution 72 to a coat region on the substrate 31 as the nozzle head 70 is moved along the coat region on the substrate 31.

Figure 12A:
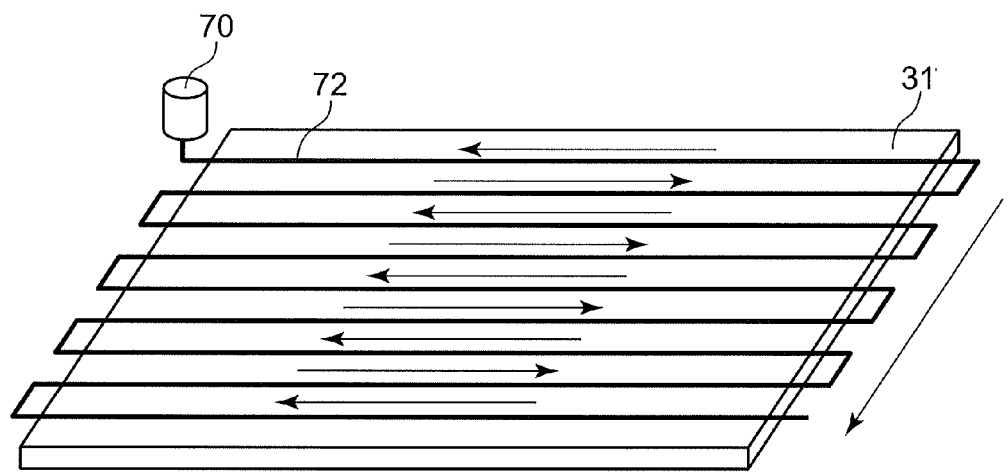
FIGS. 12A and 12B are diagrams for explaining nozzle printing.
Figure 12B:
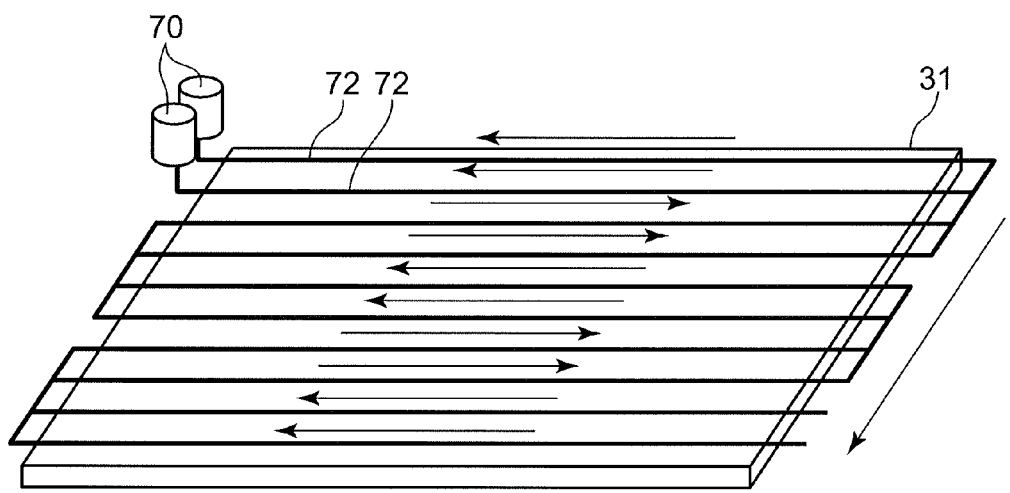
Figure 13A:
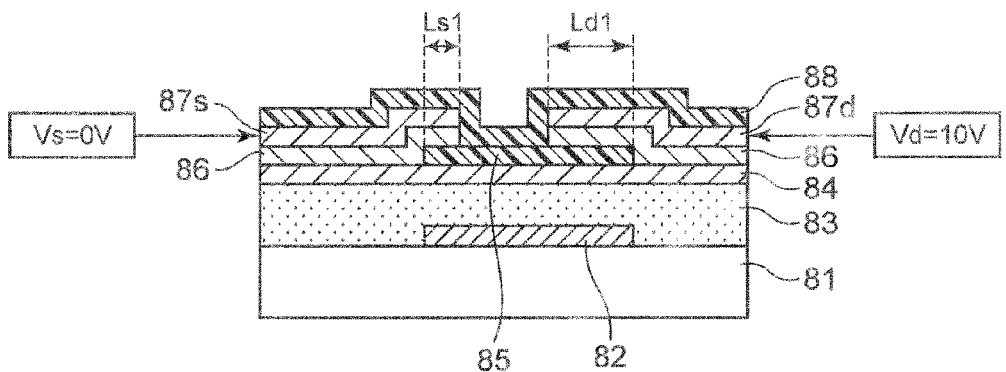
FIGS. 13A and 13B are cross-sectional views showing a conventional transistor.
Figure 13B:
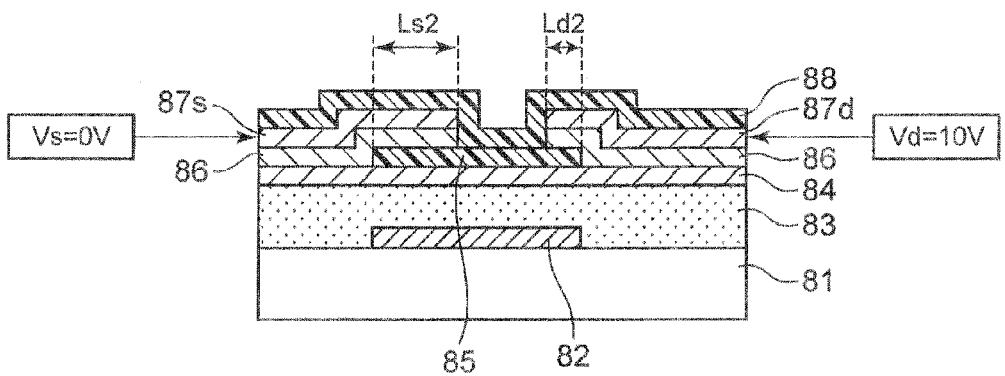
Figure 14A:
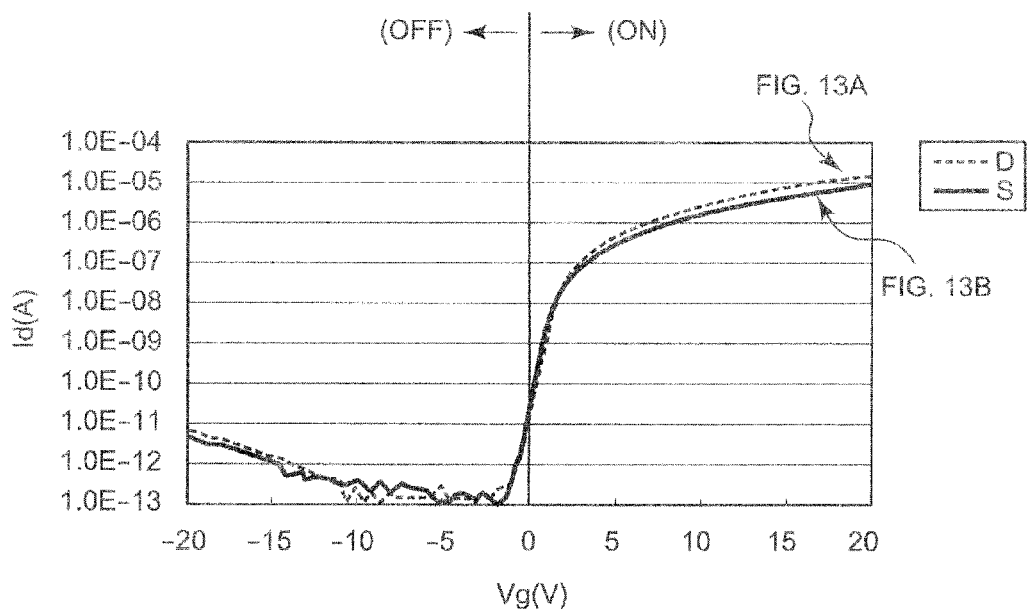
FIGS. 14A and 14B are graphs illustrating the characteristics of the transistor shown in FIG. 13.
Figure 14B:
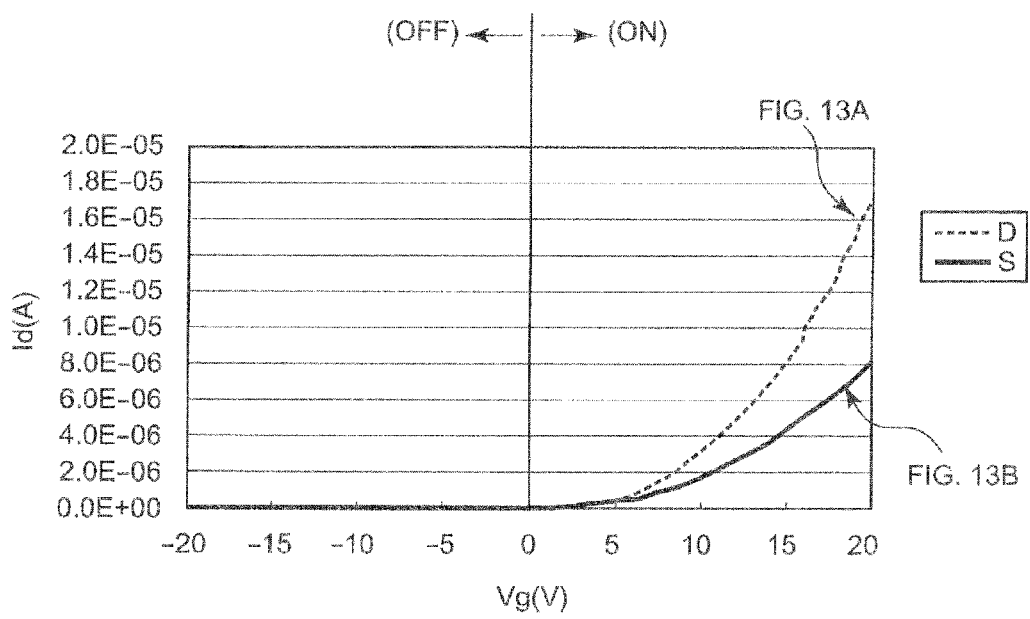

FIG. 12A shows the configuration when the nozzle printing apparatus has only one nozzle head 70, and FIG. 12B shows the configuration when the nozzle printing apparatus has two nozzle heads 70. Although FIG. 12B shows the nozzle printing apparatus which has two nozzle heads 70, which is not restrictive, the nozzle printing apparatus may have three or more nozzle heads 70.

The solution for forming the luminous layer 45 contains the aforementioned polymer luminous material. A water solvent or an organic solvent, such as tetralin, tetramethylbenzene, mesitylene, or xylene, is used as the solvent of this solution, and the solution (dispersion liquid) has a polymer luminous material dissolved (or dispersed) in this organic solvent.

As shown in FIGS. 12A and 12B, the solution 72 is ejected from the nozzle of the nozzle head 70 to be applied onto the substrate 31. The nozzle head 70 moves in the direction where the partitions 48 are formed (right and left direction in FIGS. 12A and 12B) while ejecting the solution 72 between the partitions 48.

When application to the individual columns is carried out continuously, as shown in FIGS. 12A and 12B, the substrate 31 is moved by a predetermined distance in a direction (up and down direction in FIGS. 12A and 12B) orthogonal to the direction where the partitions 48 are formed while the nozzle head 70 is positioned out of the substrate 31.

By repeating this process, the solution 72 is applied to predetermined columns. The ejection of the solution 72 may be kept or may be temporarily stopped while the nozzle head 70 is positioned out of the substrate 31.

When the nozzle printing apparatus has just one nozzle head 70 as shown in FIG. 12A, application is carried out with the moving direction of the nozzle head 70 changed alternately column by column.

When the nozzle printing apparatus has just two nozzle heads 70 as shown in FIG. 12B, application is carried out with the moving direction of the nozzle head 70 changed alternately for every two columns. Instead of moving the substrate 31, the nozzle head 70 may be moved by a predetermined distance in the direction orthogonal to the direction where the partitions 48 are formed.

As the organic-compound containing liquid is supplied between the partitions 48 this way and the solvent is volatilized, the luminous layer 45 is formed. When the luminous layer 45 is formed, the opposing electrode 46 is formed thereon, fabricating the display device 1.

According to the embodiment, as described above, the electric-field blocking film 54 is provided between the BL insulation films 53 and the BL insulation films 55 of the drive transistor T1 and the switch transistor T2.

Therefore, the electric-field blocking film 54 blocks an electric field generated by the drain electrode T1d, the source electrode T1s and the $n^+$-Si film 56, so that even if misalignment of the drain electrode T1d, the source electrode T1s, and the $n^+$-Si film 56 occurs, a variation in the characteristic of each of the drive transistor T1 and the switch transistor T2 can be reduced.

Accordingly, a variation in ON current is also reduced, making a variation in the amount of light from the organic EL element E smaller.

According to the present embodiment, in both the drive transistor T1 and the switch transistor T2, the electric-field blocking film 54 is provided between the BL insulation films 53 and the BL insulation films 55. However, it suffices if at least only the drive transistor T1 is constructed so that the electric-field blocking film 54 is provided between the BL insulation films 53 and the BL insulation films 55.

This is because the switch transistor T2 having a capability of applying a voltage to the gate electrode T1g of the drive transistor T1, so that there is little merit in stabilizing the ON current.

As the drive transistor T1 having a capability of letting the current to flow toward the organic EL element E from the anode line La(j) takes the configuration according to the embodiment, the drive transistor T1 is hardly affected by the misalignment, and can let a stable current flow toward the organic EL element E, so that the organic EL element E can emit light of a desired level.

Although an n-type semiconductor is used for a semiconductor film according to the embodiment, a p-type semiconductor may be used as well. In case of a p-type semiconductor, the electric-field blocking film 54 should overlap at least the source electrode T1s in the layer direction. When a p-type semiconductor film is used, a $p^-$-Si film is used whereas the $n^+$-Si film 56 is used in the embodiment.

Although a display device including an organic EL element E is illustrated according to the embodiment, the invention is applicable to a display device including a liquid crystal device.

Having described and illustrated the principles of this application by reference to one preferred embodiment, it should be apparent that the preferred embodiment may be modified in arrangement and detail without departing from the principles disclosed herein and that it is intended that the application be construed as including all such modifications and variations insofar as they come within the spirit and scope of the subject matter disclosed herein.

What is claimed is:

1. A transistor comprising:
   a semiconductor film formed above a substrate;
   a blocking film formed on the semiconductor film, the blocking film comprising a first insulation film, an electric-field blocking film, and a second insulation film stacked on top of one another in a layer thickness direction; and
   a drain electrode and a source electrode formed on the blocking film so as to oppose each other,
   wherein the electric-field blocking film overlaps at least a part of the drain electrode in the layer thickness direction when viewed in section with the second insulation film intervening between the electric-field blocking film and the overlapped part of the drain electrode, and wherein the electric-field blocking film is formed of a conductive material having translucency.

2. The transistor according to claim 1, wherein each of (i) the overlapped part of the drain electrode and (ii) a part of the source electrode overlaps the electric-field blocking film in the layer thickness direction when viewed in section.

3. The transistor according to claim 1, further comprising an impurity semiconductor film that electrically connects the drain electrode and the source electrode to the semiconductor film, wherein the impurity semiconductor film is formed between the electric-field blocking film and each of the drain electrode and the source electrode, and wherein the electric-field blocking film blocks an electric field formed by the drain electrode, the source electrode, and the impurity semiconductor film.

4. The transistor according to claim 1, wherein the electric-field blocking film is set to a voltage within a preset range.

5. The transistor according to claim 1, further comprising a gate electrode to which the electric-field blocking film is connected.

6. The transistor according to claim 1, wherein the first insulation film and the second insulation film are formed of a same material.

7. A display device comprising:

the transistor as set forth in claim 1; and a light emitting device having a pixel electrode, an opposing electrode, and a luminous layer formed between the pixel electrode and the opposing electrode, wherein the transistor as set forth in claim 1 is connected to the pixel electrode.

8. The display device according to claim 7, wherein the electric-field blocking film is formed of a same material as the pixel electrode.

9. An electronic device comprising the display device as set forth in claim 7.

10. A display device comprising:

a light emitting device having a pixel electrode, an opposing electrode, and a luminous layer formed between the pixel electrode and the opposing electrode;

the transistor as set forth in claim 1, the transistor being a drive transistor that drives the light emitting device; and a switch transistor that selects the light emitting device.

* * * * *

UNITED STATES PATENT AND TRADEMARK OFFICE
CERTIFICATE OF CORRECTION

PATENT NO.        : 8,653,569 B2                                  Page 1 of 1
APPLICATION NO.   : 12/891855
DATED             : February 18, 2014
INVENTOR(S)       : Kashio et al.

It is certified that error appears in the above-identified patent and that said Letters Patent is hereby corrected as shown below:

On the Title page; Item (75) Inventors, line 1:

Delete "Toyko (JP)" and insert --Tokyo (JP)--.

On the Title page; below Item (65) Prior Publication Data:

Insert --(30) Foreign Application Priority Data

Sep 30, 2009   (JP) .....................2009-229063--.

Signed and Sealed this
Twenty-second Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO.        : 8,653,569 B2                                             Page 1 of 1
APPLICATION NO.   : 12/891855
DATED             : February 18, 2014
INVENTOR(S)       : Tatsuya Miyakawa It is certified that error appears in the above-identified patent and that said Letters Patent is hereby corrected as shown below:

On the Title page; Item (12) should read -- Miyakawa --.

On the Title page; Item (75) Inventors, line 1:

delete "Yukio Kashio Toyko (JP);".

Signed and Sealed this
Seventeenth Day of February, 2015

Michelle K. Lee
*Deputy Director of the United States Patent and Trademark Office*